(12) United States Patent
Hofmann et al.

(10) Patent No.: US 9,287,244 B2
(45) Date of Patent: Mar. 15, 2016

(54) SEMICONDUCTOR LIGHT DEVICE HAVING A GALVANIC NON-INSULATED DRIVER

(75) Inventors: Markus Hofmann, Bad Abbach (DE); Thomas Preuschl, Sinzing (DE); Klaus Eckert, Herbrechtingen (DE); Christoph Strauss, Regensburg (DE)

(73) Assignee: OSRAM GmbH, Munich (DE)

( * ) Notice: Subject to any disclaimer, the term of this patent is extended or adjusted under 35 U.S.C. 154(b) by 36 days.

(21) Appl. No.: 14/352,063

(22) PCT Filed: Sep. 14, 2012

(86) PCT No.: PCT/EP2012/068177
§ 371 (c)(1),
(2), (4) Date: Apr. 16, 2014

(87) PCT Pub. No.: WO2013/056932
PCT Pub. Date: Apr. 25, 2013

(65) Prior Publication Data
US 2014/0291707 A1 Oct. 2, 2014

(30) Foreign Application Priority Data

Oct. 19, 2011 (DE) .......................... 10 2011 084 795

(51) Int. Cl.
*H01L 25/075* (2006.01)
*H01L 33/62* (2010.01)
*H01L 33/64* (2010.01)
*F21K 99/00* (2010.01)

(52) U.S. Cl.
CPC .......... *H01L 25/0753* (2013.01); *F21K 9/1355* (2013.01); *H01L 33/62* (2013.01); *H01L 33/644* (2013.01); *H01L 2224/48091* (2013.01); *H01L 2224/48137* (2013.01); *H01L 2224/48464* (2013.01); *H01L 2224/73265* (2013.01)

(58) Field of Classification Search
CPC ....................................................... H01L 33/644
See application file for complete search history.

(56) References Cited

U.S. PATENT DOCUMENTS

| 8,622,587 | B2 | 1/2014 | Preuschl et al. |
| 2003/0189829 | A1* | 10/2003 | Shimizu et al. ............... 362/240 |
| 2007/0023769 | A1* | 2/2007 | Nishimoto et al. ............. 257/88 |

(Continued)

FOREIGN PATENT DOCUMENTS

| DE | 202007008258 U1 | 12/2007 |
| DE | 102009009288 A1 | 8/2010 |

(Continued)

OTHER PUBLICATIONS

International Search Report issued in the corresponding PCT application No. PCT/EP2012/068177, dated Jan. 2, 2013.
Office Action issued in the corresponding German application No. 102011084795.2, dated Sep. 27, 2012.

*Primary Examiner* — Stephen W Smoot
(74) *Attorney, Agent, or Firm* — Viering, Jentschura & Partner MBB

(57) ABSTRACT

A semiconductor light-emitting device is disclosed. The device includes a plurality of semiconductor light sources and a driver with no galvanic isolation for operating the semiconductor light sources wherein the semiconductor light sources may be divided into at least two carriers, the carriers are applied on an electrically conductive substrate, and the driver, and current-conducting regions also provided on a surface of the carriers, are electrically insulated from the substrate.

12 Claims, 7 Drawing Sheets

(56) References Cited

U.S. PATENT DOCUMENTS

| | | |
|---|---|---|
| 2009/0175041 A1 | 7/2009 | Yuen et al. |
| 2009/0195186 A1 | 8/2009 | Guest et al. |
| 2011/0128742 A9 | 6/2011 | Yuen et al. |
| 2011/0204393 A1 | 8/2011 | Masumoto et al. |
| 2011/0299292 A1 | 12/2011 | Preuschl |
| 2012/0127736 A1 | 5/2012 | Hoetzl et al. |

FOREIGN PATENT DOCUMENTS

| | | |
|---|---|---|
| DE | 102009035515 A1 | 2/2011 |
| EP | 2270385 A1 | 1/2011 |
| EP | 2302285 A2 | 3/2011 |
| EP | 2450613 A2 | 5/2012 |
| WO | 2010092100 A1 | 8/2010 |

* cited by examiner

SEMICONDUCTOR LIGHT DEVICE HAVING A GALVANIC NON-INSULATED DRIVER

RELATED APPLICATIONS

The present application is a national stage entry according to 35 U.S.C. §371 of PCT application No.: PCT/EP2012/068177 filed on Sep. 14, 2012, which claims priority from German application No.: 10 2011 084 795.2 filed on Oct. 19, 2011, and is incorporated herein by reference in its entirety.

TECHNICAL FIELD

Various embodiments relate to a semiconductor light-emitting device, having a plurality of semiconductor light sources and a driver without galvanic isolation for operating the semiconductor light sources.

WO 2010/092110 A1 discloses a light-emitting device which has a heat sink including at least one carrier applied to its outer side for at least one semiconductor light source, in particular light-emitting diode, and a cutout for accommodating a driver and at least one electrically insulating feed, which connects the cutout to the outer side of the heat sink, wherein the feed has a resting area which is connected to the outer side of the heat sink with the surfaces flush and which is at least partially covered by the carrier.

SUMMARY

Various embodiments provide a less expensive and more energy-saving semiconductor light-emitting device.

Various embodiments provide a semiconductor light-emitting device, including a plurality of semiconductor light sources and a driver with no galvanic isolation for operating the semiconductor light sources. In addition, the semiconductor light sources are divided into at least two carriers, the carriers are applied on an electrically conductive substrate, and the driver, and current-conducting regions also provided on a surface of the carriers, are electrically insulated from the substrate.

The semiconductor light sources can be arranged and aligned in a particularly versatile manner by being distributed among the at least two carriers. As a result, in particular a desired light emission characteristic or a light emission pattern can be provided comparatively easily. This enables an inexpensive and energy-saving semiconductor light-emitting device. By virtue of the electrical isolation of the driver (as a common actuation circuit for actuating the semiconductor light sources) and the current-conducting regions, a driver without galvanic isolation can also be used without any problems in respect of safety when touching contact is made with the electrically conductive substrate (for example a heat sink). Since a driver without galvanic isolation generally has a higher degree of efficiency than a driver which galvanically isolates the primary side and the secondary side from one another, namely typically of more than 90%, and in addition can be constructed at less expense, as a result the provision of a particularly inexpensive and energy-saving semiconductor light-emitting device is assisted. Thus, for example, no safety clearances are required in the driver from the primary side to the secondary side, as is often prescribed in the case of a driver outputting a protective voltage using a transformer. Isolation between the primary side and the secondary side can instead primarily take place between the carrier and the electrically conductive substrate (for example a heat sink).

If the driver is configured as a transformerless driver, the transformer can advantageously be replaced by a coil or a buck configuration/a step-down converter.

According to various embodiments, the driver is configured as a driver which outputs an (operating) voltage for operating the semiconductor light sources which is higher than a safety extra low voltage (SELV), a protective extra low voltage (PELV) or a functional extra low voltage (FELV). In principle, however, a low voltage is also conceivable as an operating voltage.

The operating voltage can advantageously be a DC voltage which is greater than or equal to 25 volts, in particular greater than or equal to 50 volts. However, in principle, a DC voltage with a lower value and an AC voltage are also usable as an operating voltage.

According to various embodiments, the at least one semiconductor light source includes at least one light-emitting diode. In the event of a provision of a plurality of light-emitting diodes, these can illuminate in the same color or in different colors. A color can be monochrome (for example red, green, blue etc.) or multichrome (for example white). The light emitted by the at least one light-emitting diode can also be an infrared light (IR LED) or an ultraviolet light (UV LED). A plurality of light-emitting diodes can generate a mixed light; for example a white mixed light. The at least one light-emitting diode can contain at least one wavelength-modifying phosphor (conversion LED). The phosphor can alternatively or additionally be arranged remotely from the light-emitting diode (remote phosphor). The at least one light-emitting diode can be present in the form of at least one individually housed light-emitting diode or in the form of at least one LED chip. A plurality of LED chips can be mounted on a common substrate (submount). The at least one light-emitting diode can be equipped with at least one dedicated and/or common optical element for beam guidance, for example at least one Fresnel lens, a collimator, etc. Instead of or in addition to inorganic light-emitting diodes, for example on the basis of InGaN or AlInGaP, in general also organic LEDs (OLEDs, for example polymer OLEDs) can be used. Alternatively, the at least one semiconductor light source can have, for example, at least one diode laser.

One configuration consists in that at least two of the carriers are arranged at an angle to one another. This can be achieved, for example, by virtue of the fact that the substrate or resting regions of the substrate for the carriers are angled with respect to one another. Thus, it is possible to produce a versatile angular alignment of the semiconductor light sources in a simple manner.

A further configuration consists in that the carriers are electrically connected to one another via at least one unsupported connecting line. An unsupported connecting line can in particular be understood to mean a connecting line which is not connected over its length to a fixed substrate (for example a conductor track), but can be laid at least in principle freely, at least sectionally (such as, for example, a wire or a cable). An unsupported connecting line has the advantage that an electrical connection of carriers which can be arranged flexibly is possible using simple means. This is in particular the case if the substrate has edges or gaps, such as can occur in particular in the case of resting regions of the substrate which are at an angle to one another and/or stepped. In addition, usually relatively low ohmic resistances and/or relatively high current intensities can be achieved. Furthermore, an unsupported connecting line can be electrically insulated particularly effectively. However, in principle, at least one fixedly laid (not unsupported) connecting line, for example a conductor track, can also be used.

A further configuration consists in that the at least one unsupported connecting line, in particular cable, is a connecting line with threefold insulation. This simplifies the laying process for the line since it is then possible for the line then also to touch the electrically conductive substrate, without posing any hazard, to be precise even for voltages which are higher than safety voltages, in particular higher than a safety extra low voltage (SELV), a protective extra low voltage (PELV) or a functional extra low voltage (FELV).

Yet a further configuration consists in that an insulating element is provided in a region between two carriers beneath the at least one electrical connecting line connecting said carriers. The insulating element can be, for example, a top layer which is laid locally between two carriers on the substrate(s) and in particular covers a region of the electrically conductive substrate with which touching contact can be made by the at least one connecting line (for example when the connecting line is intentionally or unintentionally bent onto the substrate). Thus, the requirements placed on the electrical insulation of the at least one connecting line can be reduced. In particular, the at least one connecting line can then only have single insulation, for example a cable. The insulating element can be, for example, a plastic element.

It is a preferred development for producing long leakage paths and a sufficiently high dielectric strength for at least one of the carriers to be an electrically insulating carrier. The carrier can have one or more wiring layers.

Another configuration consists in that at least one of the carriers is an (in particular compact) ceramic carrier. A ceramic carrier has a particularly high electrical insulation capacity and typically also has good thermal conductivity, with the result that effective heat dissipation from the semiconductor light source is assisted. The ceramic may include, for example, Al2O3, AlN, BN or SiC. The ceramic carrier may also be configured as a multilayered ceramic carrier, for example using LTCC technology. In this case, for example, layers with different materials, for example with different ceramics, can also be used. These may be configured, for example, alternately so as to be a high degree of dielectric strength and a low degree of dielectric strength.

In addition, a configuration consists in that at least one of the carriers includes a printed circuit board basic material (for example FR4) or is a printed circuit board, which, in comparison with a ceramic carrier, is very inexpensive. In particular, the use of an insulated metal substrate (IMS) or a metal-core printed circuit board (MCPCB) as carrier is also possible.

In order to achieve particularly advantageous compromise between maximization of the insulation gap, on the one hand, and minimization of the thermal path between the light source and the substrate, on the other hand, a thickness of the carrier can advantageously be in the range of between 0.15 mm and 1 mm.

The carrier advantageously has a dielectric strength of at least 4 kV, in order that overvoltage pulses at least of this order of magnitude cannot pass through the carrier.

Advantageously, the carrier can be fastened to the substrate by means of an electrically insulating and in particular thermally conductive interface layer. The additional electrical insulation enables a further increased level of dielectric strength and extended leakage paths.

The electrically insulating interface layer can advantageously be adhesive on both sides for the reliable connection between the carrier and the substrate. The interface layer is advantageously a thermal interface material (TIM), such as a thermally conductive paste (for example silicone oil with additives of aluminum oxide, zinc oxide, boron nitride or silver powder), a film or an adhesive. The film can also be present, for example, in the form of a double-sided adhesive tape. The adhesive can have been applied to both sides, for example by means of a dispersing operation and subsequent use of a doctor blade. In particular a TIM interface layer can in particular have the advantages of a high dielectric strength and an extension of the leakage path with good thermal permeability. Also, by means of the interface layer, a screwless design can be achieved, by means of which an insulation region otherwise required on the carrier around the screw bushings leading to the heat sink can be dispensed with. This promotes a compact design of the light-emitting device. However, the carrier can in principle also be fastened to the heat sink in another way. Thus, the carrier can also be screwed to the substrate by means of one or more plastic screws.

In addition, one configuration consists in that the carrier is applied to the substrate via the electrically insulating interface layer, and the interface layer protrudes laterally beyond the carrier. As a result, a leakage path at the respective rim can be extended by the length by which the electrically insulating interface layer protrudes laterally beyond the respective rim.

In addition, one configuration consists in that the substrate is a surface of a heat sink. As a result, a compact design and effective cooling of the semiconductor light sources are enabled. The heat sink can advantageously consist of a material with good thermal conductivity of $\lambda > 10$ W/(m·K), particularly preferably $\lambda > 100$ W/(m·K), in particular of a metal such as aluminum, copper or an alloy thereof. However, the heat sink can also consist completely or partially of a plastic; particularly advantageous for the electrical insulation and extension of the leakage paths is an electrically insulating plastic with good thermal conductivity, but it is also possible to use an electrically conductive plastic with good thermal conductivity. The heat sink can preferably be symmetrical, in particular rotationally symmetrical, for example about a longitudinal axis.

The heat sink can advantageously have cooling elements, for example cooling ribs or cooling pins.

A further configuration consists in that at least two carriers are configured as printed circuit board regions of a common flexible printed circuit board. As a result, it is possible to dispense with a separate connecting line, and instead a subregion of the flexible printed circuit board can be used as the electrical connection. Such a light-emitting device can be assembled particularly easily and is reliable.

A configuration which is advantageous for simplifying fitting and maintaining a distance between that subregion of the flexible printed circuit board which is used as the electrical connection and the substrate consists in that the at least two printed circuit board regions are arranged on in each case one heat spreading element with good thermal conductivity which is arranged on the electrically conductive substrate.

A development consists in that the heat-spreading element is electrically conductive, for example consists of metal, in particular of aluminum. Such a heat-spreading element is easily shapeable, has a high degree of thermal conductivity and is inexpensive. However, the heat-spreading element may also consist of an electrically conductive ceramic.

A further development consists in that the heat-spreading element is electrically insulating, which increases the dielectric strength and a length of leakage paths. Such a heat-spreading element can in particular have good thermal conductivity, and in particular consist of ceramic.

The heat-spreading element and the substrate can also be formed integrally.

Yet a further configuration consists in that the at least one unsupported connecting line is formed between two printed circuit board regions by at least one narrowed connecting region of the flexible printed circuit board, said connecting region having at least one conductor track. The narrowing facilitates bending of the connecting region. The narrowing can be implemented as early as during manufacture of the flexible printed circuit board or by a subsequent removal of material (for example milling or cutting).

Yet a further configuration consists in that the semiconductor light-emitting device is a retrofit lamp or is configured as a module therefor. The retrofit lamp can be overall an incandescent lamp retrofit lamp or a halogen lamp retrofit lamp.

The driver can in particular be accommodated in a cutout or cavity in a heat sink. Preferably, the cutout has an insertion opening for inserting the driver, for example a driver printed circuit board. The insertion opening in the cutout can advantageously be located at a rear side of the heat sink. The insertion opening and the feed are advantageously located on opposite sides of the cutout. The cutout can be cylindrical, for example. The cutout can advantageously be electrically insulated from the heat sink in order to avoid direct leakage paths, for example by means of an electrically insulating cladding (also referred to as housing of the driver cavity, HDC), for example in the form of a plastic tube inserted into the cutout through the insertion opening. The cladding may include one or more fastening elements for fastening the driver.

A development consists in that the cutout is connected to the outer side of the heat sink by means of an electrically insulating feed. The feed is used in particular for feeding or leading through at least one electrical line between the driver located in the cutout and at least one semiconductor light source or the carrier equipped therewith. The feed and the cladding may be configured integrally as a single element. As the cladding is inserted into the cutout, at the same time the feed is then also pushed through a through-opening in the heat sink.

The at least one electrical line, which can be in the form of a wire, a cable or connector of any type, for example, can be contact-connected by means of any suitable method, for example by means of soldering, resistance welding, laser welding, etc.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

The following detailed description refers to the accompanying drawing that show, by way of illustration, specific details and embodiments in which the disclosure may be practiced.

Figure 1:
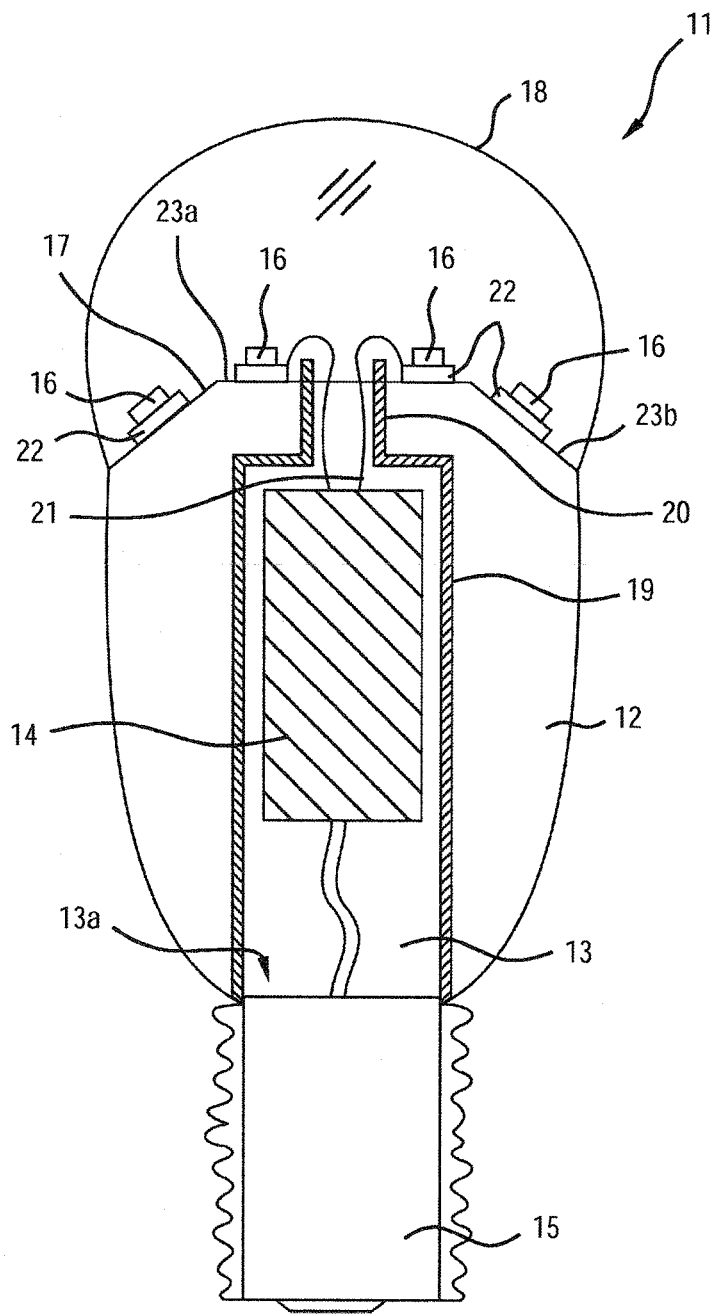
FIG. 1 shows a sketch as a sectional illustration in a side view of a semiconductor light-emitting device including a driver without galvanic isolation in the form of an incandescent lamp retrofit lamp.

FIG. 1 shows a semiconductor light-emitting device 11 in the form of an incandescent lamp retrofit lamp. The semiconductor light-emitting device 11 has a heat sink 12 consisting of aluminum, which has a cutout 13 (driver cavity) for accommodating a driver 14. The driver 14 serves the purpose of converting electrical supply signals available via a lamp base 15 into electrical operating signals for operating a plurality of semiconductor light sources in the form of light-emitting diodes 16.

The lamp base 15 is in this case present, by way of example, in the form of an Edison base, which can in particular be inserted into a lampholder to which a mains voltage can be applied. The lamp base 15 closes a rearward insertion opening 13a of the cutout 13 and represents a rear end of the semiconductor light-emitting device 11.

In contrast, the light-emitting diodes 16 are fitted to a front side 17 of the heat sink 12 and can be covered, for example, by a light-transmissive (transparent or diffuse) bulb 18. The light-emitting diodes 16 can in particular be present as LED chips.

The driver 14 is configured as a driver without galvanic isolation, i.e. its primary side which is electrically connected to the lamp base 15 and its secondary side which is electrically connected to the light-emitting diodes 16 are not galvanically isolated from one another, which enables a high degree of efficiency. In order to electrically insulate the driver 14 with respect to the heat sink 12, the cutout 13 is clad with an electrically insulating cladding 19 in the form of a plastic tube inserted into the cutout 13. The cutout 13 is connected to the front side 17 of the heat sink 12 by means of an electrically insulating feed 20 and is electrically connected to the light-emitting diodes 16 via electrical lines 21 passing through the feed 20.

Figure 2:
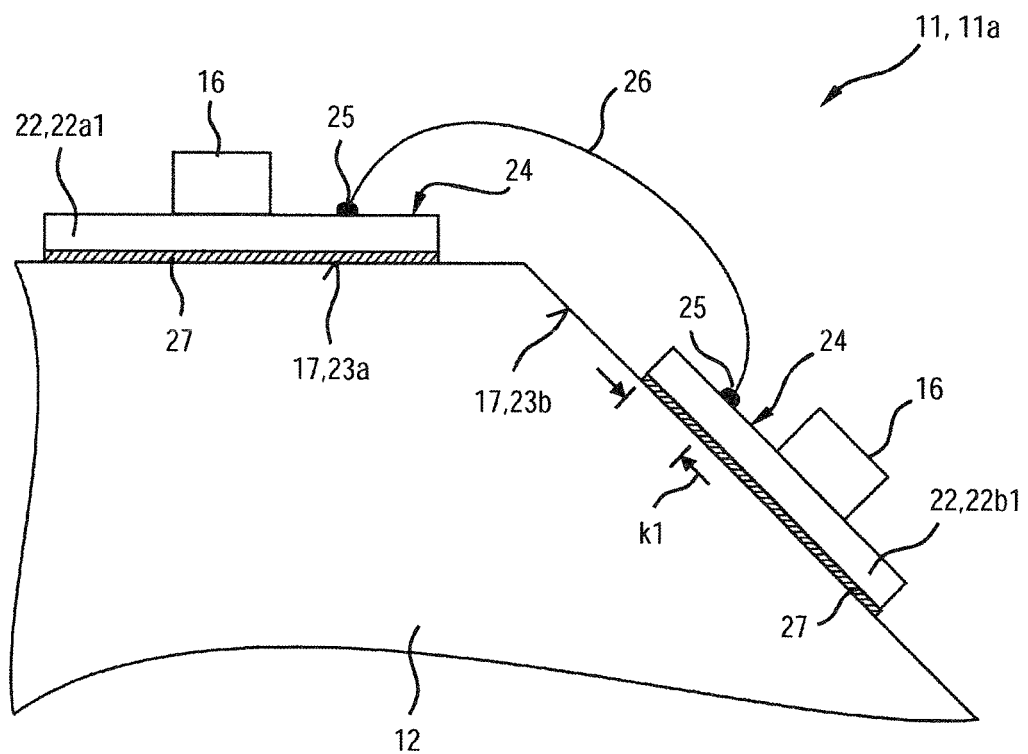
FIGS. 2 to 7 each show a sectional illustration in a side view of a detail of a first to sixth possible configuration of the semiconductor light-emitting device in the region of its front side equipped with semiconductor light sources.

FIG. 2 shows a detail of the semiconductor light-emitting device 11 with a first possible configuration 11a in the region of its front side 17 populated with light-emitting diodes 16.

The light-emitting diodes 16 are distributed among at least two carriers 22, of which in this case a first carrier 22a1 and a second carrier 22b1 are illustrated. The two carriers 22 or 22a1 and 22b1 are applied to the electrically conductive heat sink 12 on the substrate, to be precise on mutually adjoining resting regions 23a and 23b, respectively, which are at an angle to one another.

The driver 14 is electrically connected to the carrier 22a1 via at least one of the electrical lines 21 (see FIG. 1), and (since the carrier 22a1 has an upper-side wiring layer 24 which electrically connects a contact point 25 of the electrical line 21 to the light-emitting diode 16) therefore also to the light-emitting diode 16. In addition, the carriers 22a1 and 22b1 are electrically connected to one another via an unsupported connecting line 26, for example in order to implement an electrical series circuit or parallel circuit of the carriers 22a1 and 22b1 or of the light-emitting diodes 16 applied thereto.

In order to ensure electrical insulation of the current-conducting regions provided on a surface of the carriers 22a1 and 22b1 (i.e. the wiring layer 24 and the contact point 25) with respect to the heat sink 12, the carriers 22a1, 22b1 in this case consist of an electrically insulating material, namely compact ceramic. While the front side of the (ceramic) carriers 22a1, 22b1 is populated with the light-emitting diodes 16, the carriers 22a1, 22b1 are fastened with their rear side, via a double-sided adhesive tape 27 acting as electrically insulating interface layer and TIM layer, on the respective resting region 23a and 23b, respectively.

A leakage path k1 extends, for example, on the carrier 22b1 from the contact point 25 to the next lateral rim (deducting the thickness of the carrier 22b1 and the adhesive tape 27).

In order to ensure that the unsupported connecting line 26 is sufficiently well electrically insulated from the heat sink 12, to be precise even when the connecting line 26 is intended to make touching contact with the heat sink 12, the connecting line 26 has threefold insulation, for example is in the form of a cable with three-fold insulation.

Figure 3:
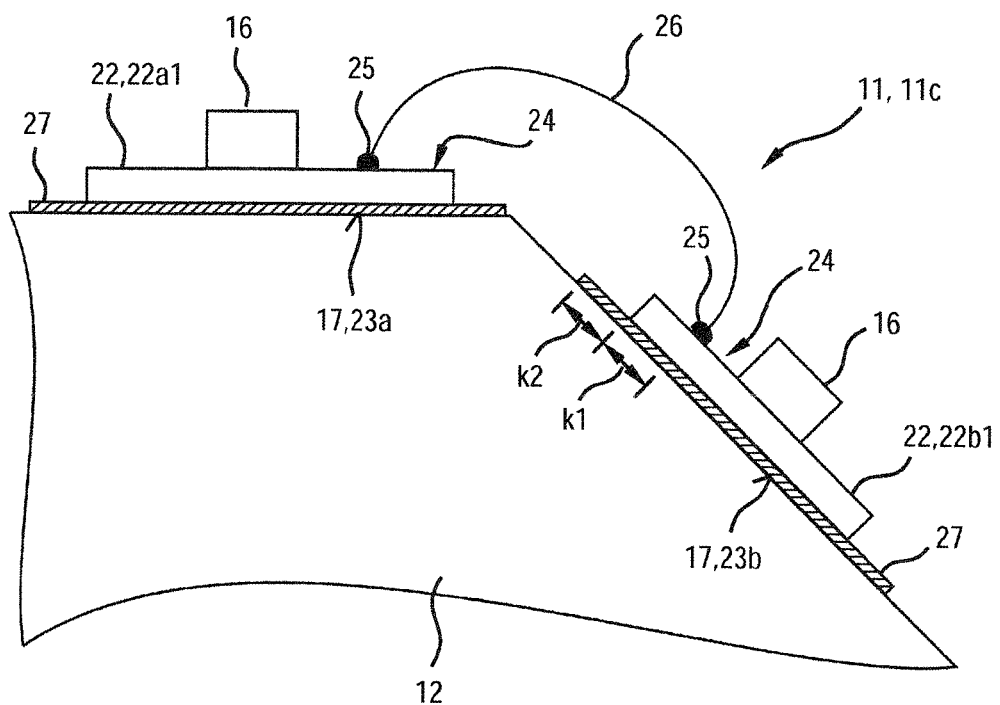

FIG. 3 shows a detail of the semiconductor light-emitting device 11 with a second possible configuration 11b in the region of its front side 17 populated with the light-emitting diodes 16.

In contrast to the semiconductor light-emitting device 11 in its first possible configuration 11a, the double-sided adhesive tape 27 now protrudes laterally beyond the respective carrier 22a1, 22b1. The leakage path k1 is therefore extended by the lateral overhang k2 of the double-sided adhesive tape 27 acting as additional insulation, which improves a protective effect.

Figure 4:
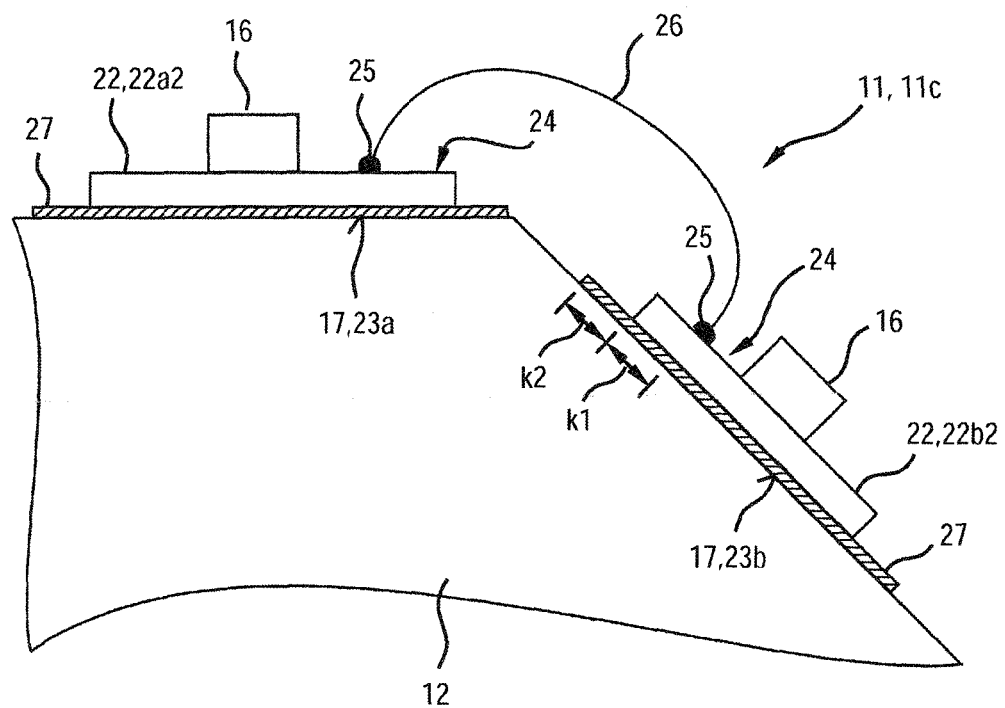

FIG. 4 shows a detail of the semiconductor light-emitting device 11 with a third possible configuration 11c in the region of its front side 17 populated with the light-emitting diodes 16. This configuration 11c differs from the second configuration 11b in that the carriers 22a2 and 22b2 are now produced substantially with a printed circuit board basic material as the electrical insulating material, in particular with or including FR4. This enables a more cost-efficient design.

Figure 5:
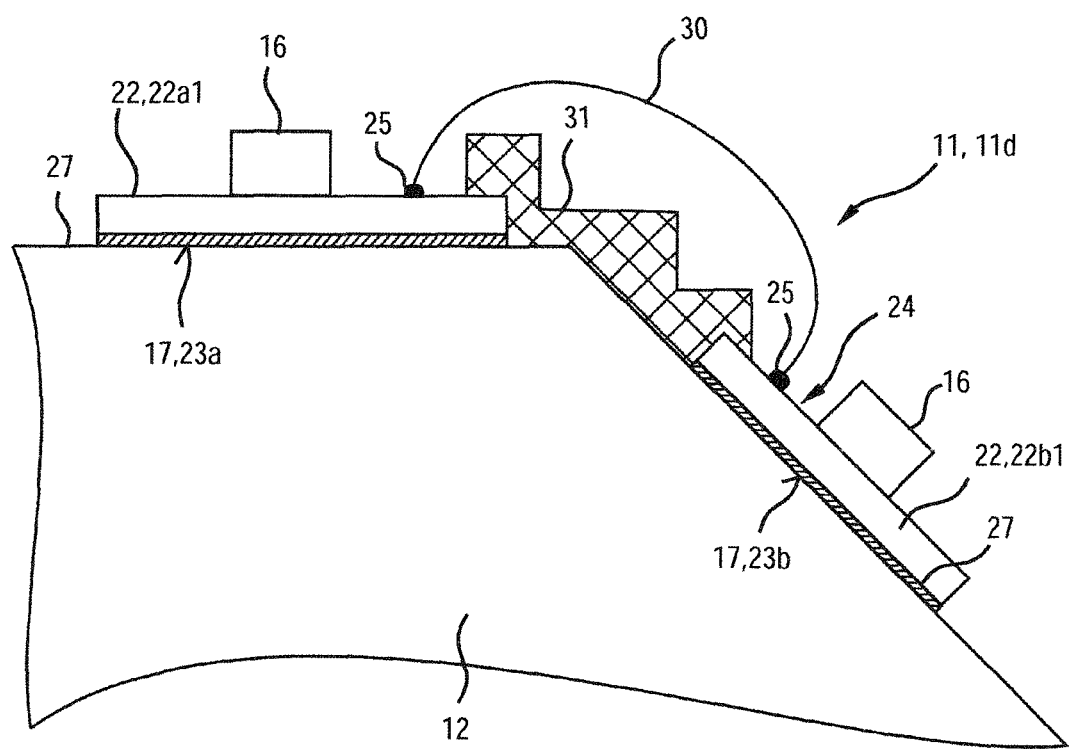

FIG. 5 shows a detail of the semiconductor light-emitting device 11 with a fourth possible configuration 11d in the region of its front side 17 populated with the light-emitting diodes 16. This configuration 11d differs from the preceding configurations 11a-c (shown by way of example in relation to the first possible configuration 11a) in that an electrically insulating insulating element 31 is provided in a region between the two carriers 22a1 and 22b1 beneath the connecting line 30. The insulating element 31 is in this case a top layer consisting of plastic and in particular covers a region of the front side 17 of the heat sink 12, with which touching contact could be made by the connecting line 30, for example when the connecting line 30 rests intentionally or unintentionally on the heat sink 12. Thus, requirements placed on the electrical insulation of the at least one connecting line 30 can be reduced, and this connecting line can then now only have single insulation, for example.

Figure 6:
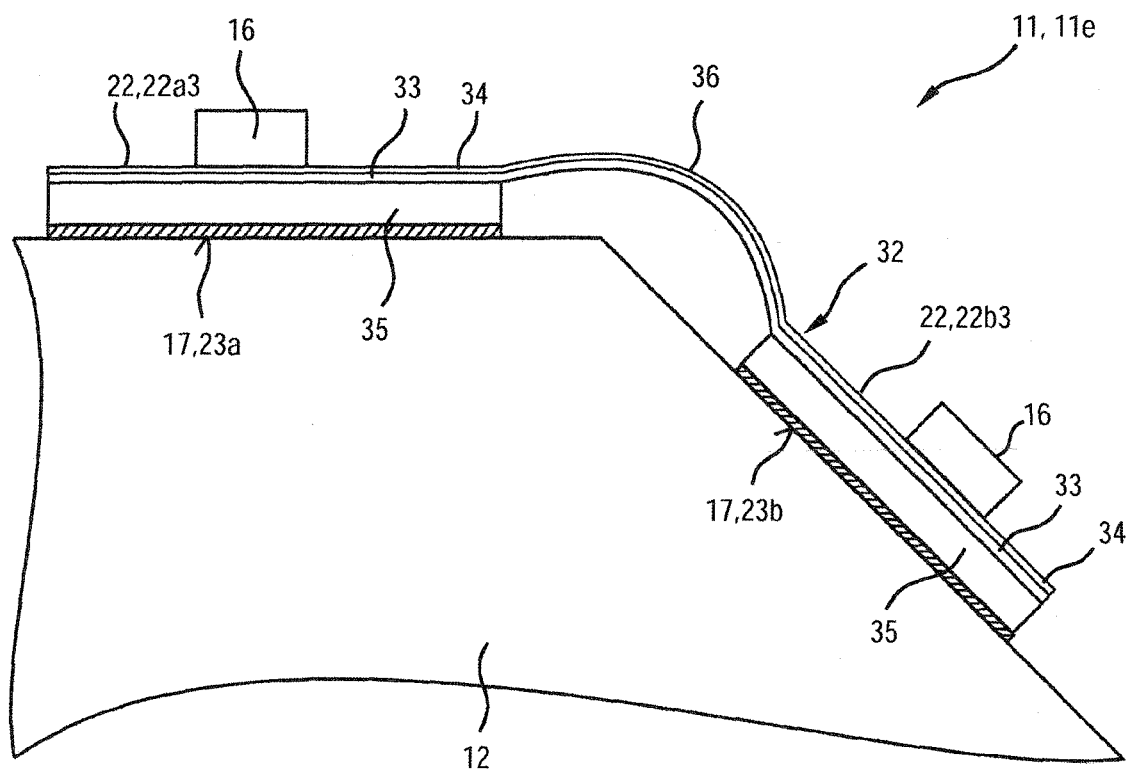

FIG. 6 shows a detail of the semiconductor light-emitting device 11 with a fifth possible configuration 11e in the region of its front side 17 populated with the light-emitting diodes 16. In this case, the carriers are configured as printed circuit board regions 22a3 and 22b3 of a common flexible printed circuit board 32. The flexible printed circuit board 32 has a flexible, electrically insulating substrate 33 with a metallic wiring layer 34. The two printed circuit board regions 22a3 and 22b3 shown are arranged on in each case one heat-spreading element 35 consisting of aluminum, which is fastened on the heat sink 12 via the laterally protruding double-sided adhesive tape 27.

The unsupported connecting line 36 between the printed circuit board regions 22a3 and 22b3 is formed by a narrowed (in this case perpendicular to the plane of the figure) region having at least one conductor track of the wiring layer 34 ("connecting region") of the flexible printed circuit board 32. The printed circuit board regions 22a3 and 22b3 and the connecting line 36 are therefore integral components of the flexible printed circuit board 32. This configuration 11e is thus particularly reliable and can be fitted particularly easily. The simplicity of installation and electrical insulation of the connecting line 36/the connecting region with respect to the heat sink 12 is assisted by the provision of the heat-spreading elements 35.

Figure 7:
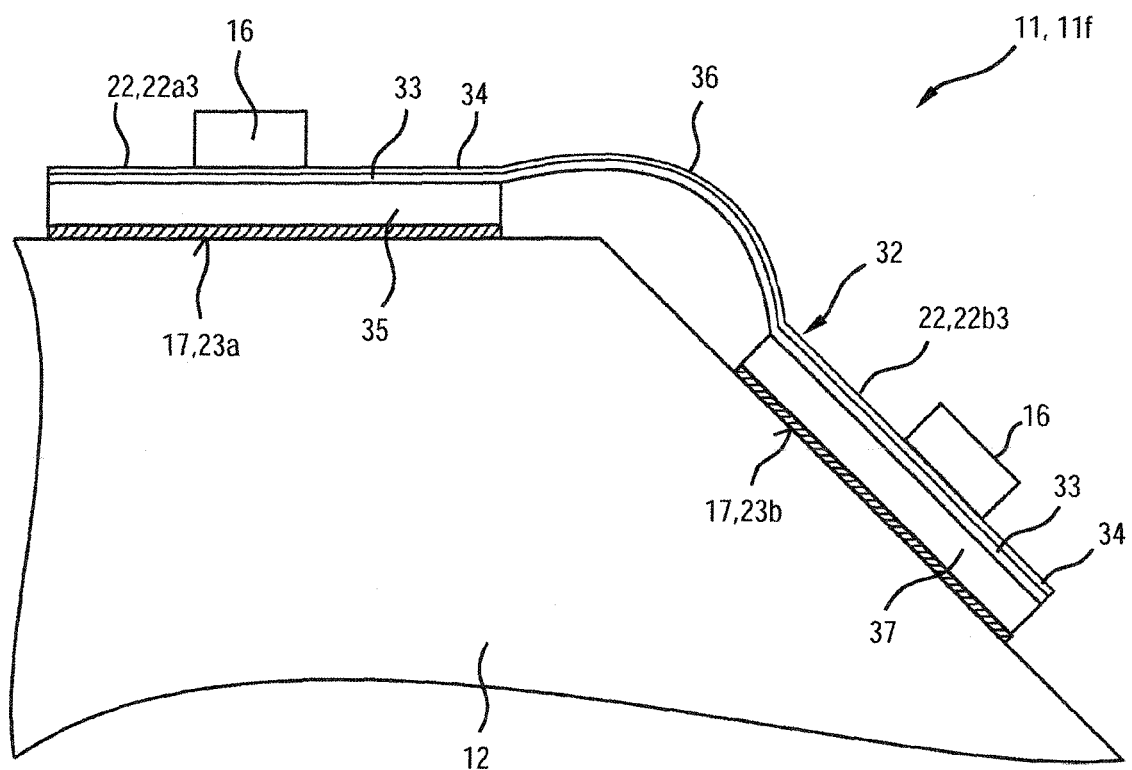

FIG. 7 shows a detail of the semiconductor light-emitting device 11 with a sixth possible configuration 11f similar to the fifth configuration.

In this case, the heat-spreading elements 37 now consist of ceramic. This extends a leakage path and thus enables a more versatile configuration of the printed circuit board regions 22a3 and 22b3.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

Thus, features of the possible configurations shown can also be mixed and/or replaced, for example by providing a laterally protruding double-sided adhesive tape.

A carrier can also have one or more semiconductor light sources.

The invention claimed is:

1. A semiconductor light-emitting device, comprising:
a plurality of semiconductor light sources and
a driver with no galvanic isolation for operating the semiconductor light sources, wherein
the semiconductor light sources are divided into at least two carriers,
the carriers are applied on an electrically conductive substrate,
and the driver, and current-conducting regions also provided on a surface of the carriers, are electrically insulated from the substrate,
wherein the carriers are electrically connected to one another via at least one unsupported connecting line,
wherein the at least one unsupported connecting line is a connecting line with threefold insulation.

2. The semiconductor light-emitting device as claimed in claim 1, wherein at least two of the carriers are arranged so as to be angled with respect to one another.

3. The semiconductor light-emitting device as claimed in claim 1, wherein an insulating element is provided in a region between two carriers beneath at least one electrical connecting line connecting said carriers.

4. The semiconductor light-emitting device as claimed in claim 1, wherein at least one of the carriers is a ceramic carrier.

5. The semiconductor light-emitting device as claimed in claim 1, wherein at least one of the at least two carriers is applied to the substrate via an electrically insulating interface layer, and the interface layer protrudes laterally beyond the carrier.

6. The semiconductor light-emitting device as claimed in claim 1, wherein the substrate is a surface of a heat sink.

7. A semiconductor light-emitting device as claimed in claim 1, wherein the semiconductor light-emitting device is a retrofit lamp.

8. A semiconductor light-emitting device, comprising:
a plurality of semiconductor light sources and
a driver with no galvanic isolation for operating the semiconductor light sources, wherein
the semiconductor light sources are divided into at least two carriers,
the carriers are applied on an electrically conductive substrate, and the driver, and current-conducting regions also provided on a surface of the carriers, are electrically insulated from the substrate,
wherein at least one of the carriers comprises a printed circuit board basic material.

9. A semiconductor light-emitting device, comprising:
a plurality of semiconductor light sources and
a driver with no galvanic isolation for operating the semiconductor light sources, wherein
the semiconductor light sources are divided into at least two carriers,
the carriers are applied on an electrically conductive substrate,
and the driver, and current-conducting regions also provided on a surface of the carriers, are electrically insulated from the substrate,
wherein the carriers are electrically connected to one another via at least one unsupported connecting line,
wherein at least two carriers are configured as printed circuit board regions of a common flexible printed circuit board.

10. The semiconductor light-emitting device as claimed in claim 9, wherein the at least two printed circuit board regions are arranged on in each case one heat-spreading element, which is arranged on the electrically conductive substrate.

11. The semiconductor light-emitting device as claimed in claim 9, wherein the at least one unsupported connecting line is formed between two printed circuit board regions by at least one narrowed connecting region of the flexible printed circuit board, said connecting region having at least one conductor track.

12. The semiconductor light-emitting device as claimed in claim 10, wherein the at least one unsupported connecting line is formed between two printed circuit board regions by at least one narrowed connecting region of the flexible printed circuit board, said connecting region having at least one conductor track.

\* \* \* \* \*